United States Patent
Harada

(10) Patent No.: US 7,358,565 B2
(45) Date of Patent: Apr. 15, 2008

(54) SEMICONDUCTOR DEVICE HAVING IMPROVED INSULATED GATE BIPOLAR TRANSISTOR AND METHOD FOR MANUFACTURING THE SAME

(75) Inventor: Tatsuo Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/514,994

(22) Filed: Sep. 5, 2006

(65) Prior Publication Data
US 2007/0267663 A1  Nov. 22, 2007

(30) Foreign Application Priority Data
May 19, 2006  (JP) ............................. 2006-140313

(51) Int. Cl.
  *H01L 29/76*  (2006.01)
  *H01L 21/336*  (2006.01)
(52) U.S. Cl. ............... 257/330; 257/331; 257/E29.201; 438/270; 438/272
(58) Field of Classification Search ................ 257/330, 257/331, E29.201, E21.384; 438/270, 272
See application file for complete search history.

(56) References Cited

U.S. PATENT DOCUMENTS 6,768,168 B1 * 7/2004 Takahashi .................. 257/330
6,781,200 B2 * 8/2004 Ishimura et al. ............ 257/330
7,211,837 B2 * 5/2007 Tomomatsu et al. ........ 257/156
2005/0263853 A1 * 12/2005 Tomomatsu et al. ........ 257/565

FOREIGN PATENT DOCUMENTS

JP  2005-347289  12/2005

OTHER PUBLICATIONS

H. Takahashi et al., "Carrier Stored Trench-Gate Bipolar Transistor (CSTBT)—A Novel Power Device for High Voltage Application", Proc. ISPSD, 1996, pp. 349-352.

* cited by examiner

*Primary Examiner*—T. N. Quach
(74) *Attorney, Agent, or Firm*—Oblon, Spivak, McClelland, Maier & Neustadt, P.C.

(57) ABSTRACT

An n-type first base layer is formed on a semiconductor substrate 1 having a first major surface and a second major surface, and a p-type second base layer is formed thereon. Between the first base layer and the second base layer, a carrier stored layer is formed. The carrier stored layer has a high-concentration impurity layer and a low concentration impurity layer, and the high-concentration impurity layer has a thickness of 1.5 μm or more and an impurity concentration therethrough is made to be $1.0 \times 10^{16}$ cm$^{-3}$ or more throughout the layer.

15 Claims, 3 Drawing Sheets

SEMICONDUCTOR DEVICE HAVING IMPROVED INSULATED GATE BIPOLAR TRANSISTOR AND METHOD FOR MANUFACTURING THE SAME

BACKGROUND OF THE INVENTION

1. Field of the Invention

The present invention relates to a semiconductor device and a method for manufacturing the same, and specifically to an insulated gate semiconductor device having an insulated gate bipolar transistor and a method for manufacturing the same.

2. Background Art

In a power semiconductor element, an insulated gate bipolar transistor (hereafter abbreviated as "IGBT") having a trench structure is widely used as a switching element. An example of IGBT structures will be described below.

An n-type base layer is formed between a first major surface and a second major surface of a semiconductor substrate, and a p-type base layer is formed on the first major surface side of the n-type base layer. In the p-type base layer, an n-type emitter layer is selectively formed. A trench is formed extending through the n-type emitter layer and the p-type base layer, and an insulating film is formed along the inner surface thereof. Through the insulating film, a gate electrode is buried in the trench. A p-type collector layer is formed on the second major surface side of the n-type base layer.

In operation of the IGBT, in other words, when a predetermined voltage is applied between the gate and the emitter, a channel is formed along the trench in the p-type base layer, the connection between the collector and the emitter is turned on, and a current flows. At this time, it is desired that the collector-emitter voltage, i.e. on-voltage is as low as possible. It is also desired that power loss when the IGBT is turned off, i.e. turn-off loss is as small as possible. In general, the reduction of the on-voltage is in a tradeoff relation with the suppression of the turn-off loss.

In Japanese Unexamined Patent Publication No. 2005-347289, the structure of IGBT wherein a carrier stored layer having a high impurity concentration than the n-type base layer is formed between the p-type base layer and the n-type base layer so as to reduce the on-voltage is disclosed.

In the above-described conventional IGBT, normally, the n-type impurity in the carrier stored layer is in normal distribution in the depth direction of the semiconductor substrate. Therefore, there was a problem wherein the thickness of the portion of the carrier stored layer having high impurity concentration was thinned, and the on-voltage could not be sufficiently reduced.

SUMMARY OF THE INVENTION

The present invention has been developed to solve the above-described problems, and therefore it is an object of the present invention to provide an insulated gate semiconductor device that can reduce the on-voltage between the collector and the emitter while suppressing the power loss in turnoff, and a method for manufacturing such an insulated gate semiconductor device.

The above object is achieved by an insulated gate semiconductor device that includes a semiconductor substrate which has a first major surface and a second major surface, a first base layer of a first conductivity type formed between the first major surface and the second major surface of the semiconductor substrate, a second base layer of a second conductivity type formed on the first major surface of the semiconductor substrate, a carrier stored layer of a first conductivity type formed between the first base layer and the second base layer of the semiconductor substrate, and having a high-concentration impurity layer that has a higher impurity concentration than the first base layer, an emitter layer selectively formed in the second base layer of the semiconductor substrate, and having a predetermined distance from the carrier stored layer, a trench extending from the first major surface of the semiconductor substrate through the emitter layer and the second base layer, an insulating film covering the inner surface of the trench, an electrode buried in the trench through the insulating film, and a collector layer of a second conductivity type formed on the second major surface of the semiconductor substrate, and the high-concentration impurity layer has a thickness of 1.5 µm or more, and the impurity concentration of the high-concentration impurity layer is $1.0 \times 10^{16}$ cm$^{-3}$ or more throughout the high-concentration impurity layer.

The above object is achieved by a method for manufacturing an insulated gate semiconductor device that includes the steps of forming a carrier stored layer having a high-concentration impurity layer of a first conductivity type that has higher impurity concentration than a first base layer of a first conductivity type formed between a first major surface and a second major surface of a semiconductor substrate within a range from said first major surface to a first depth of said semiconductor substrate, forming a second base layer of a second conductivity type contacting said high-concentration impurity layer of said carrier stored layer within a range from said first major surface to a second depth shallower than said first depth of said semiconductor substrate, selectively forming an emitter layer of the first conductivity type within a range from said first major surface to a third depth shallower than said second depth of said semiconductor substrate, forming a trench extending from said first major surface of said semiconductor substrate through said emitter layer and said second base layer, covering the inner surface of said trench with an insulating film, burying an electrode film in said trench through said insulating film, and forming a collector layer of the second conductivity type on said second major surface of said semiconductor substrate, and said high-concentration impurity layer has a thickness of 1.5 µm or more, and the impurity concentration of said high-concentration impurity layer is $1.0 \times 10^{16}$ cm$^{-3}$ or more throughout said high-concentration impurity layer.

According to the present invention, an insulated gate semiconductor device that can reduce the on-voltage between the collector and the emitter while suppressing the power loss in turnoff, and a method for manufacturing the same, can be obtained.

Other features and advantages of the invention will be apparent from the following description taken in connection with the accompanying drawings.

DETAILED DESCRIPTION OF THE PREFERRED EMBODIMENTS

Figure 1:
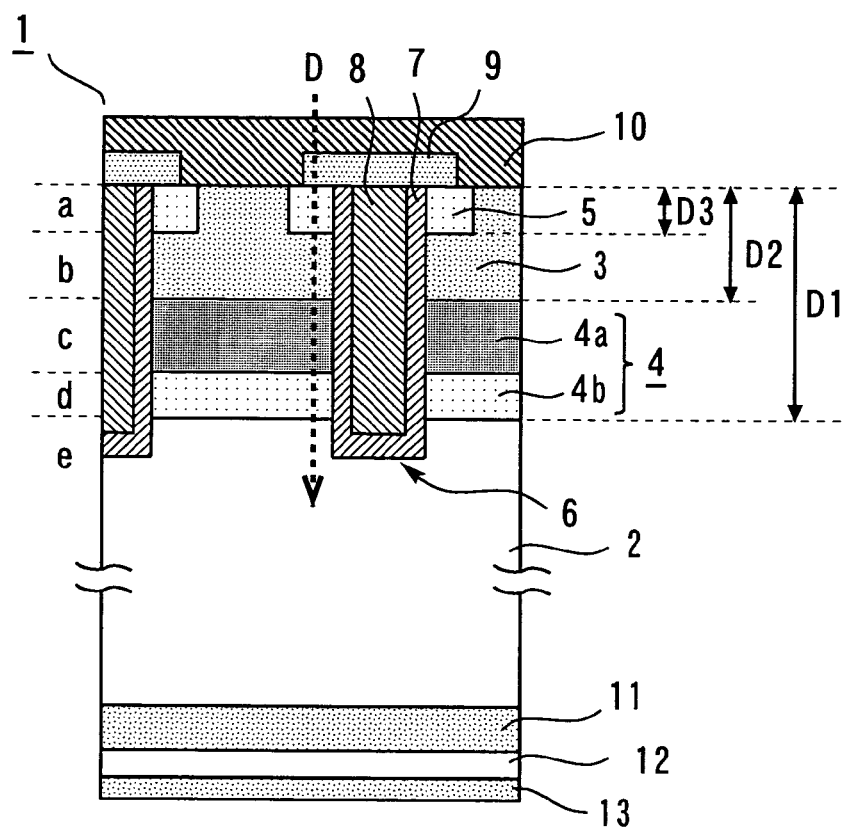
FIG. 1 shows a cross sectional view of the insulated gate semiconductor device of the first embodiment.

Embodiments of the present invention will be described below referring to the drawings. In the drawings, the same or equivalent parts will be denoted by the same reference numerals, and the description thereof will be simplified or omitted.

First Embodiment

An insulated gate semiconductor device according to the first embodiment will be described referring to FIG. 1. The semiconductor device has an insulated gate bipolar transistor (hereafter abbreviated as "IGBT") of a trench type. The semiconductor device is formed using a semiconductor substrate 1 having a first major surface (upper major surface) and a second major surface (lower major surface), and between the first major surface and the second major surface of the semiconductor substrate 1, an n-type (first conductivity type) first base layer 2 containing an n-type impurity is formed. On the first major surface of the semiconductor substrate 1, a p-type (second conductivity type) second base layer 3 is formed. Between the first base layer 2 and the second base layer 3 of the semiconductor substrate 1, a carrier stored layer 4 is formed. The carrier stored layer 4 has a n-type high-concentration impurity layer 4a having a higher impurity concentration than the first base layer 2, and a low concentration impurity layer 4b having a lower impurity concentration than the high-concentration impurity layer 4a.

The high-concentration impurity layer 4a of the carrier stored layer 4 is formed so as to contact the second base layer 3, and the other portion of the carrier stored layer 4, that is the low concentration impurity layer 4b, is formed between the high-concentration impurity layer 4a and the first base layer 2. The impurity concentration of the low concentration impurity layer 4b is higher than the impurity concentration of the first base layer 2, and lower than the impurity concentration of the high-concentration impurity layer 4a.

An n-type emitter layer 5 is selectively formed in the second base layer 3 in the vicinity of the first major surface of the semiconductor substrate 1. The emitter layer 5 is formed in the vicinity of the first major surface of the semiconductor substrate 1 so as to have a predetermined distance from the carrier stored layer 4. A trench 6 is formed in the semiconductor substrate 1 from the first major surface side of the semiconductor substrate 1 extending through the emitter layer 5, the second base layer 3, and the carrier stored layer 4. A first insulating film 7 is formed so as to cover the inner surface of the trench 6. Through the first insulating film 7, a gate electrode 8 is buried in the trench 6. A second insulating film 9 is formed so as to cover the upper surface of the trench 6 and the upper surface of the emitter layer 5. On the portion where the emitter layer 5 and the second base layer 3 are exposed on the first major surface of the semiconductor substrate 1, an emitter electrode 10 is formed. By this structure, the emitter electrode 10 is electrically connected to the emitter layer 5 and the second base layer 3.

On the second major surface (lower major surface) side of the semiconductor substrate 1, an n-type buffer layer 11 is formed so as to cover the first base layer 2, and a p-type collector layer 12 is formed so as to further cover the n-type buffer layer 11. Specifically, the p-type collector layer 12 is formed on the second major surface of the semiconductor substrate 1. Furthermore, on the second major surface, a collector electrode 13 is formed so as to cover the p-type collector layer 12, and the collector electrode 13 is electrically connected to the p-type collector layer 12.

Here, the operation of the IGBT shown in FIG. 1 will be described. First, a predetermined voltage is applied between the collector and the emitter, and a predetermined voltage is applied between the gate and the emitter to turn on between the collector and the emitter. At this time, a channel is formed in a region of the second base layer 3 along the trench 6. Then, electrons are injected from the emitter electrode 10 into the first base layer 2 through the emitter layer 5, the channel formed in the second base layer 3 and the carrier stored layer 4. On the other hand, holes are injected from the collector electrode 13 into the first base layer 2 through the p-type collector layer 12 and the n-type buffer layer 11. Thus, a current flows between the collector and the emitter. At this time, holes injected from the first base layer 2 are accumulated in the carrier stored layer 4. The holes promote the electron current to spread laterally.

Next, the impurity concentration profile of the insulated gate semiconductor device shown in FIG. 1 will be described. The levels of the emitter layer 5, the second base layer 3, the high-concentration impurity layer 4a, the low concentration impurity layer 4b, and the first base layer 2 along the depth direction D of the semiconductor substrate 1 shown in FIG. 1 are denoted by a, b, c, d and e, respectively. The result of plotting carrier concentrations corresponding to the depths Xj of these levels from the first major surface of the semiconductor substrate 1 is shown in FIG. 2. The carrier concentration of a semiconductor device according to a conventional art is shown by dotted line A, and the carrier concentration of a semiconductor device according to the first embodiment is shown by solid line B.

As FIG. 2 shows, in the carrier concentration profiles shown by dotted line A (conventional art) and solid line B (first embodiment), valleys are formed at the boundary between level a and level b, and the boundary between level b and level c. This is because the pn junction of the emitter layer 5 and the second base layer 3 is formed at the boundary between level a and level b, and the pn junction of the second base layer 3 and the carrier stored layer 4 is formed at the boundary between level b and level c.

The carrier concentration shown by dotted line A (conventional art) in FIG. 2 lowers at levels c and d with increase in Xj. Specifically, in an insulated gate semiconductor device according to the conventional art, the carrier concentration in the carrier stored layer 4 lowers with increase in the depth Xj from the major surface of the semiconductor substrate 1. However, the carrier concentration shown by solid line B (first embodiment) is substantially constant at $2.0 \times 10^{16}$ cm$^{-3}$ within a range of 2.0 µm$\leq$Xj<4.5 µm (the high-concentration impurity layer 4a) of level c, and is substantially constant at $7.0 \times 10^{14}$ cm$^{-3}$ within a range of 4.5 µm$\leq$Xj<6.0 µm (the low concentration impurity layer 4b) of level d. And at the boundary between level c and level d, the carrier concentration varies stepwise.

Specifically in the insulated gate semiconductor device according to the first embodiment, the carrier stored layer 4 has a carrier concentration of $1.0 \times 10^{16}$ cm$^{-3}$ or more, and includes a high-concentration impurity layer 4a having a thickness of 1.5 μm or more. The impurity concentration of the high-concentration impurity layer 4a in the depth direction of the semiconductor substrate 1 is substantially constant within a range between $1.0 \times 10^{16}$ cm$^{-3}$ and $1.0 \times 10^{17}$ cm$^{-3}$. Furthermore, the insulated gate semiconductor device has a structure wherein the impurity concentration of the carrier stored layer 4 in the depth direction of the semiconductor substrate 1 is stepwise varied at the boundary between the high-concentration impurity layer 4a and the low concentration impurity layer 4b.

Specifically in the insulated gate semiconductor device according to the first embodiment, the high-concentration impurity layer 4a in the carrier stored layer 4 has a thickness of 1.5 μm or more, and the impurity concentration of the high concentration impurity layer 4a is $1.0 \times 10^{16}$ cm$^{-3}$ or more in the entire high concentration impurity layer 4a. By such a structure, it is found that the spreading of electron current in the lateral direction in carrier stored layer 4 can be promoted, and the hole accumulation effect in the carrier stored layer 4 can be enhanced.

The first embodiment has a structure wherein the trench 6 extending through the carrier stored layer 4. Here, in the structure wherein the bottom face of the trench 6 is formed in the carrier stored layer 4, there is a case wherein the edge portion on the bottom face of the trench 6 is positioned in the vicinity of the boundary between the first base layer 2 and the carrier stored layer 4 due to the fluctuation of the manufacturing process or the like. In such a case, there is a problem wherein the fluctuation of withstand voltage between the collector and the emitter increases. However, since the first embodiment has a structure wherein the trench 6 extending through the carrier stored layer 4, the structural design to expand the margin can be possible by making the bottom face of the trench 6 sufficiently deeper than the bottom face of the carrier stored layer 4. Thereby, the fluctuation of withstand voltage between the collector and the emitter due to the fluctuation of the manufacturing process or the like can be minimized.

Figure 3:
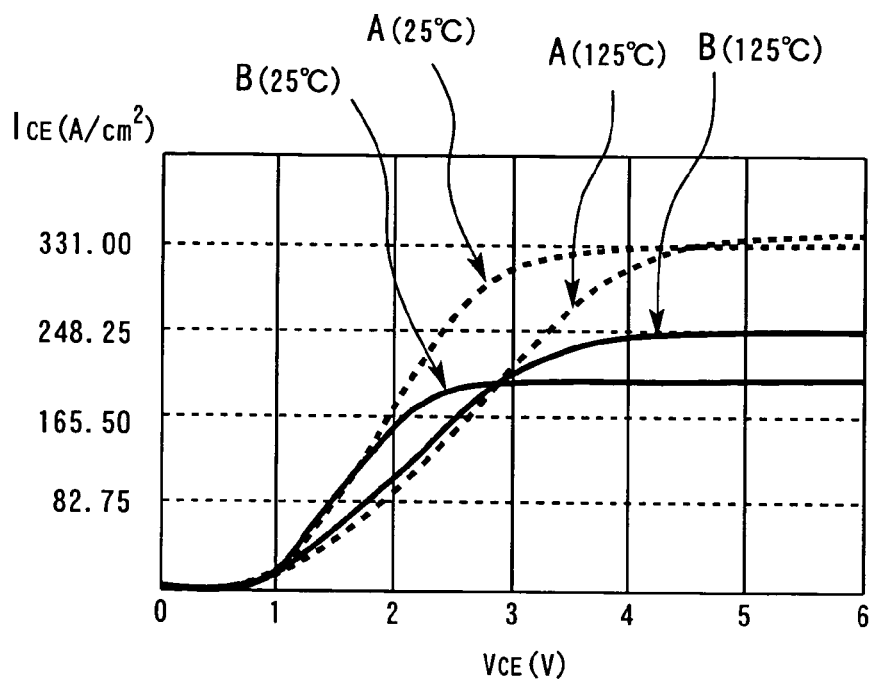
FIG. 3 shows the current-voltage characteristics between the collector and the emitter of the semiconductor device of the first embodiment.

Next, the on-voltage and saturation current of the insulated gate semiconductor device according to the first embodiment will be described. FIG. 3 shows current-voltage characteristics between the collector and the emitter ($I_{CE}$-$V_{CE}$ characteristics) of the semiconductor device shown in FIG. 1 and the semiconductor device according to conventional art. In the FIG. 3, the $I_{CE}$, the current between the collector and the emitter, is expressed by a current density in the semiconductor device for convenience, not by an immediate current value. The $I_{CE}$-$V_{CE}$ characteristics of the semiconductor device according to conventional art at 25° C. and 125° C. are expressed as A (25° C.) and A (125° C.), respectively. The $I_{CE}$-$V_{CE}$ characteristics of the semiconductor device according to the first embodiment at 25° C. and 125° C. are expressed as B (25° C.) and B (125° C.), respectively.

In the FIG. 3, when the gate voltage $V_{GE}$ (the voltage between the gate and the emitter) is 15V (constant) and a predetermined collector-emitter current density $I_{CE}$ (herein, 84.5 A/cm$^2$) flows, the $V_{CE}$ is herein defined as the on-voltage. When on-voltages of A (25° C.) and B (25° C.) are compared, the on-voltage of B (25° C.) is lower. When on-voltages of A (125° C.) and B (125° C.) are compared, the on-voltage of A (125° C.) is 1.94 V, and the on-voltage of B (125° C.) is 1.81 V. Specifically, compared with the on-voltage of A (125° C.), the on-voltage of B (125° C.) is lower by about 6.7%. Therefore, it is known that the semiconductor device according to the first embodiment can reduce the on-voltage compared with the semiconductor device according to the conventional art under either temperature condition of 25° C. or 125° C.

Figure 2:
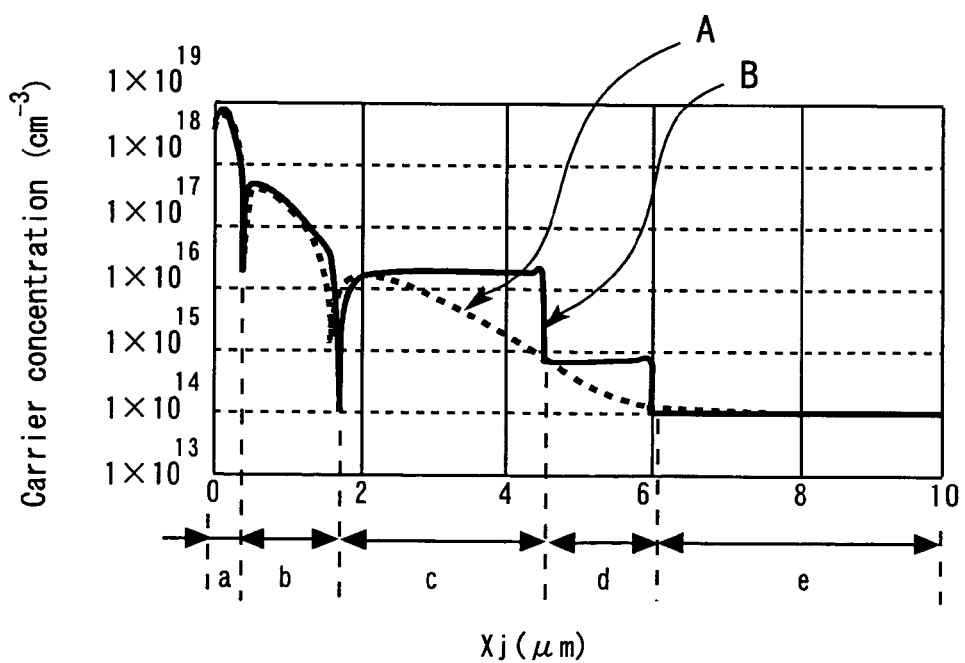
FIG. 2 shows a carrier concentration profile of the insulated gate semiconductor device of the first embodiment.

It is thought that because the high-concentration impurity layer 4a shown in FIG. 1 has a thickness of 1.5 μm or more and the impurity concentration of the layer is $1.0 \times 10^{16}$ cm$^{-3}$ or more throughout the layer, the spreading of electron current in the lateral direction in the carrier stored layer 4 is promoted, and the resistance in the high-concentration impurity layer 4a is reduced. In addition, it is found that the semiconductor device shown in FIG. 1 can make the power loss in turnoff substantially constant even if the on-voltage was reduced. Specifically, by the insulated gate semiconductor device according to the first embodiment, the on-voltage can be reduced while suppressing the power loss in turnoff.

Next, currents when the current of $I_{CE}$ saturates, i.e. saturation current, were compared. When the saturation current values of A (25° C.) and B (25° C.) are compared, the saturation current of B (25° C.) is smaller. Similarly, when the saturation current values of A (125° C.) and B (125° C.) are compared, the saturation current of B (125° C.) is smaller. Therefore, it is known that the semiconductor device according to the first embodiment can reduce the saturation current value compared with the semiconductor device according to the conventional art under either temperature condition of 25° C. or 125° C. Therefore, an SCSOA (Short Circuit Safe Operation Area) or the like is improved by the semiconductor device of the first embodiment compared to the priority art.

By the semiconductor device according to the first embodiment, as described above, the on-voltage between the collector and the emitter can be reduced while suppressing the power loss in turnoff.

Next, a method for manufacturing a semiconductor device according to the first embodiment will be described referring to FIG. 1. First, a semiconductor substrate 1 having a first major surface (upper major surface) and a second major surface (lower major surface) provided with an n-type (first conductivity type) first base layer 2 between these major surfaces is prepared.

Next, within a range from the first major surface to a first depth D1 of the semiconductor substrate 1, a carrier stored layer 4 having an n-type high-concentration impurity layer 4a of a higher impurity concentration than the first base layer 2, and a low concentration impurity layer 4b of a lower impurity concentration than the high-concentration impurity layer 4a is formed. This step is carried out using an epitaxial growth method.

When epitaxial growth is used, vapor phase epitaxy (VPE) is carried out so that a high-concentration impurity layer 4a and a low concentration impurity layer 4b of desired carrier concentrations are formed by adding and adjusting a reaction gas, such as AsH$_3$ (arsine) and PH$_3$ (phosphine). In addition, the epitaxial growth layers are formed as the semiconductor substrate 1 (the carrier concentration with the epitaxial growth is equal to that of the high-concentration impurity layer) in the region where the second base layer 3 and the emitter layer 5 are formed by subsequent process, as well as a carrier stored layer 4. In other words, the portion of D1 in the FIG. 1 is formed by the epitaxial growth.

Next, within a range from the first major surface to a second depth D2 shallower than the first depth D1 of the semiconductor substrate 1, a p-type (the second conductivity type) second base layer 3 contacting the high-concentration impurity layer 4a of the carrier stored layer 4 is formed. This process step is carried out using ion implantation method. For example, a p-type impurity such as boron is implanted from the first major surface of the semiconductor substrate 1. After the second base layer 3 is formed, thermal treatment is done if needed to obtain the high-concentration impurity layer 4a of the carrier stored layer 4, wherein the impurity layer is made to have a thickness of 1.5 μm or more, and is made to have an impurity concentration of $1.0 \times 10^{16}$ cm$^{-3}$ or more throughout the layer.

Next, using lithography, ion implantation, and heat treatment or the like, within a range from the first major surface to a second depth D3 shallower than the first depth D2 of the semiconductor substrate 1, an n-type emitter layer 5 is selectively formed in the region where the trench 6 is formed subsequently.

Next, using lithography and dry etching or the like, a trench 6 is formed from the first major surface side of the semiconductor substrate 1 extending through the n-type emitter layer 5 which is selectively formed, the second base layer 3, and the carrier stored layer 4. Next, the inner surface of the trench 6 is covered with a first insulating film 7 such as a silicon oxide film. Then, as an electrode film 8, conductive material such as a polycrystalline silicon film is buried in the trench 6 through the first insulating film 7 using CVD or the like.

Then, using CVD method, lithography, and dry etching or the like, a second insulating film 9 such as a silicon oxide film is formed so as to cover partially the upper surface of the trench 6 and the upper surface of the emitter layer 5. Furthermore, using an aluminum sputtering or the like, an emitter electrode 10 is formed on the exposed portion of the emitter layer 5 and the second base layer 3. Consequently, these layers and the emitter electrode 10 are connected electrically on the first major surface of the semiconductor substrate 1.

Thereafter, using ion implantation and heat treatment, an n-type buffer layer 11 is formed so as to cover the second major surface side of the first base layer 2. Then, using ion implantation and heat treatment, a p-type collector layer 12 is formed on the second major surface of the semiconductor substrate 1 so as to cover the n-type buffer layer 11. Furthermore, a collector electrode 13, which is composed of aluminum or the like, is formed on the second major surface of the semiconductor substrate 1, and the electrode is electrically connected to the p-type collector layer 12.

Using the above-described manufacturing method, the insulated gate semiconductor device shown in FIG. 1 can be formed.

Second Embodiment

An insulated gate semiconductor device according to the second embodiment will be described referring to FIG. 4. Here, the description will be focused around aspects different from those in FIG. 1 in the first embodiment. The semiconductor device according to the first embodiment shown in FIG. 1 has a structure wherein a high-concentration impurity layer 4a is formed in the location c of the semiconductor substrate 1, and a low concentration impurity layer 4b is formed in the location d. Whereas the semiconductor device according to the second embodiment shown in FIG. 4 has a structure wherein a carrier stored layer 4 composed of only a high-concentration impurity layer 4a is formed under the second base layer 3 apart from the second base layer 3 by a predetermined distance (D4-D2). Specifically, the semiconductor device shown in the second embodiment has a structure wherein the high-concentration impurity layer 4a of the carrier stored layer 4 is formed under the second base layer 3 apart from the second base layer 3. Other configurations are identical to those shown in FIG. 1 in the first embodiment.

By the above-described structure, the range wherein the impurity for forming the carrier stored layer 4 is distributed can be prevented from overlapping the range wherein the impurity for forming the second base layer 3 is distributed. Specifically, by such a structure, the formation of the second base layer 3 in the carrier stored layer having a concentration of a normal distribution is not required as in the semiconductor device according to conventional art. And by the structure, the second base layer 3 can be formed in the region where the impurity concentration distribution is flat, and the second base layer 3 can be stably formed.

Therefore, the fluctuation of impurity concentration distribution of the second base layer 3 can be suppressed, and the shortening of the distance between the bottom face of the emitter layer 5 and the bottom face of the second base layer 3 (channel shortening) can be prevented. Therefore, similar to the effect of the first embodiment, the saturation current can be minimized, and the fluctuation thereof can be reduced. As a result, the fluctuation of withstand voltage between the collector and the emitter can be reduced.

Next, the impurity concentration profile of the insulated gate semiconductor device shown in FIG. 4 will be described referring to FIG. 5. Here, the description will be focused around the aspects different from FIG. 2 shown in the first embodiment. The carrier concentration of a semiconductor device according to the second embodiment is indicated by solid line C. The carrier concentration indicated by dotted line A (conventional art) is lowered with increase in Xj within the range of levels c and d. However, the carrier concentration indicated by solid line C (second embodiment) is substantially constant at $9.0 \times 10^{13}$ cm$^{-3}$ within the range of 2.0 μm≦Xj<4.5 μm of level c. This carrier concentration is also substantially constant at $2.0 \times 10^{16}$ cm$^{-3}$ within the range of 4.5 μm≦Xj<6.0 μm (carrier stored layer 4) of level d. Furthermore, this carrier concentration is substantially constant at $9.0 \times 10^{13}$ cm$^{-3}$ within the range of 6.0 μm≦Xj<10 μm of level e, and is as large as the carrier concentration at level c. The carrier concentration changes stepwise at the boundary between level c and level d, and the boundary between level d and level e. Other configurations are identical to those shown in FIG. 2 in the first embodiment.

Figure 6:
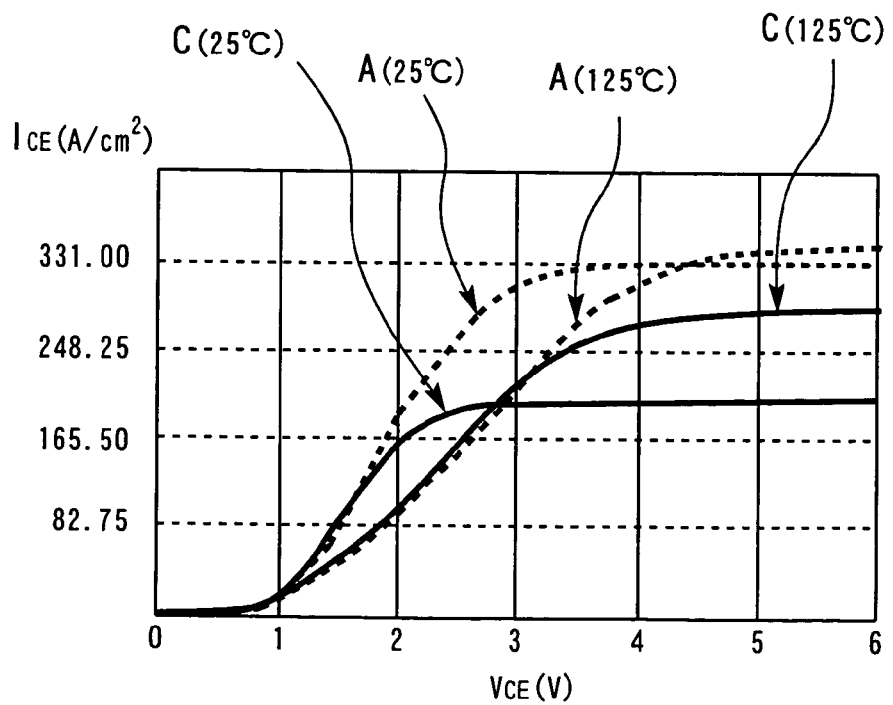
FIG. 6 shows the current-voltage characteristics between the collector and the emitter of the semiconductor device of the second embodiment.

Next, the on-voltage and saturation current of an insulated gate semiconductor device according to the second embodiment will be described referring to FIG. 6. Here, the description will be focused around the aspects different from FIG. 3 shown in the first embodiment. In the same way as in FIG. 3, the $I_{CE}$-$V_{CE}$ characteristics of the semiconductor device according to conventional art at 25° C. and 125° C. are expressed as A (25° C.) and A (125° C.), respectively. The $I_{CE}$-$V_{CE}$ characteristics of the semiconductor device according to the second embodiment at 25° C. and 125° C. are expressed as C (25° C.) and C (125° C.), respectively. When on-voltages of A (25° C.) and C (25° C.) are compared, the on-voltage of C (25° C.) is lower. Similarly, when the on-voltages of A (125° C.) and C (125° C.) are compared, the on-voltage of A (125° C.) is 1.94 V and the on-voltage of C (125° C.) is 1.86 V. Specifically, the on-voltage of C (125° C.) is about 4.1% lower than the on-voltage of A (125° C.). Therefore, it is known that the semiconductor device according to the second embodiment can reduce the on-voltage compared with the semiconductor device according to the conventional art under either temperature condition of 25° C. or 125° C.

As described above, by the insulated gate semiconductor device according to the second embodiment, similar to the effect obtained in the first embodiment, the saturation current between the collector and the emitter can be suppressed to a low value, and the fluctuation can also be reduced. As a result, the fluctuation in withstand voltage between the above-described electrodes can be reduced.

Next, a method for manufacturing an insulated gate semiconductor device according to the second embodiment will be described referring to FIG. 4. Here, the description will be focused around the aspects different from the manufacturing method described for the first embodiment, that is, the manufacturing method for the carrier stored layer 4.

In the first embodiment, a carrier stored layer 4 was formed within the range from the first major surface to a first depth D1 of a semiconductor substrate 1 (levels a, b, c and d in FIG. 1), and thereafter, a p-type second base layer 3 contacting the high-concentration impurity layer 4a of the carrier stored layer 4 was formed within the range from the first major surface to a second depth D2 shallower than the first depth D1 of the semiconductor substrate 1.

Figure 4:
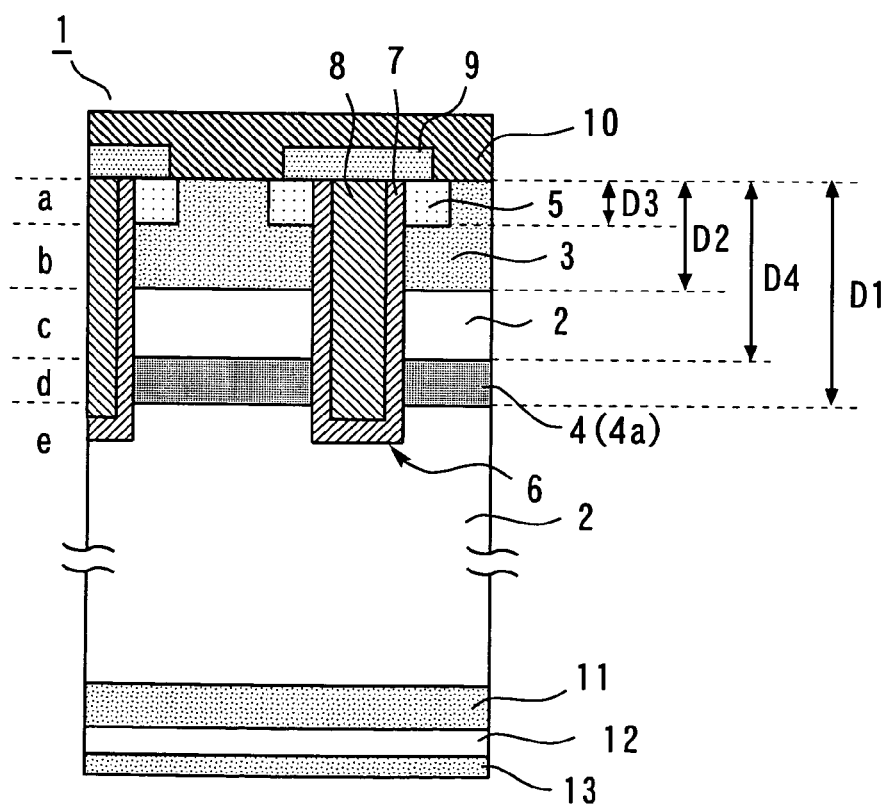
FIG. 4 shows a cross sectional view of the insulated gate semiconductor device of the second embodiment.
Figure 5:
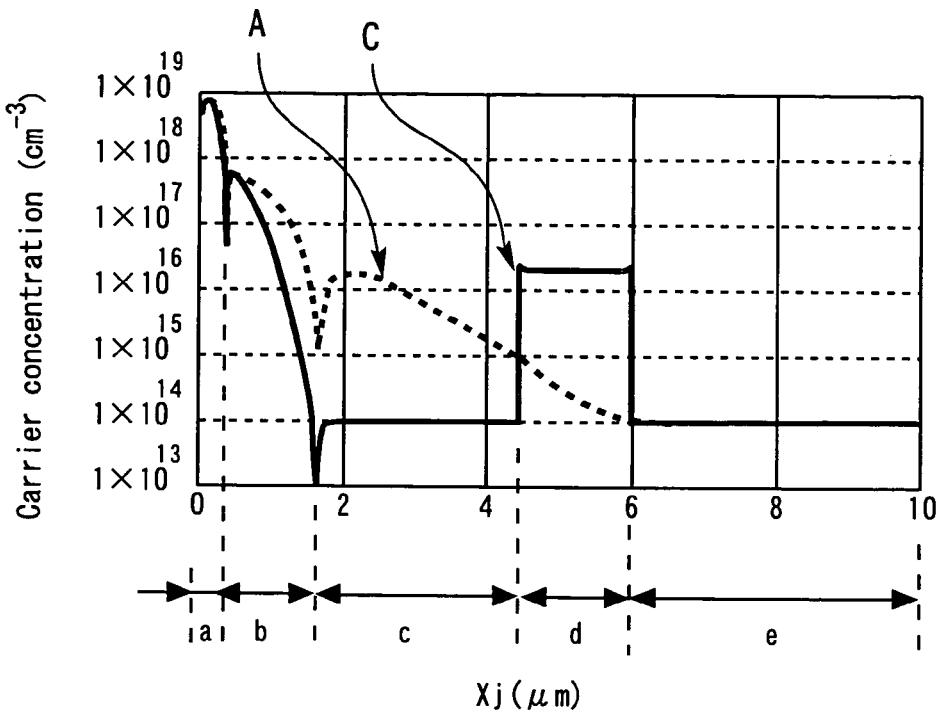
FIG. 5 shows a carrier concentration profile of the insulated gate semiconductor device of the second embodiment.

Whereas in the second embodiment 2, the high-concentration impurity layer 4a of the carrier stored layer 4 is formed within the range from a fourth depth D4 deeper than the depth D2 from the first major surface to the first depth D1 of a semiconductor substrate 1 (level d in FIG. 4). This process step is carried out using a high-energy ion implantation method or a proton irradiation method as well as the epitaxial growth method.

When the epitaxial growth method is used, basically similarly to the first embodiment, reactive gases such as AsH3 (Arsine) or PH3 (Phosphine) are added and adjusted for instance, and vapor phase epitaxial growth (VPE) is carried out to form a high-concentration impurity layer 4a as a carrier accumulation layer 4 which contains desired carrier concentration, and a first base layer 2.

In addition, epitaxial growth layers are formed as the semiconductor substrate 1 (the carrier concentration with the epitaxial growth is equal to that of the first base layer) in the region where the second base layer 3 and the emitter layer 5 are formed by subsequent process, as well as the carrier accumulation layer 4 and the first base layer 2. In other words, the portion of D1 in the FIG. 4 is formed by the epitaxial growth.

When the high-energy ion implantation method is used, ions of an n-type impurity such as phosphorus or arsenic is implanted while the acceleration of the implantation is adjusted if necessary so that an impurity layer of a desired impurity concentration is formed at a desired depth from the first major surface of the semiconductor substrate 1.

Besides above, a proton irradiation method can be used instead of the ion implantation of an n-type impurity such as phosphorus and arsenic.

Then, a p-type second base layer 3 is formed within the range from the first major surface to a second depth D2 shallower than the fourth depth D4 of the semiconductor substrate 1, so as to be apart from the high-concentration impurity layer 4a of the carrier stored layer 4. And then, the following process steps of the forming the emitter layer 5 etc., is similar to the first embodiment.

Using the above-described manufacturing method, the insulated gate semiconductor device shown in FIG. 4 can be formed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2006-140313, filed on May 19, 2006 including specification, claims, drawings and summary, on which the Convention priority of the present application is based, are incorporated herein by reference in its entirety.

The invention claimed is:

1. An insulated gate semiconductor device comprising:
   a semiconductor substrate having a first major surface and a second major surface;
   a first base layer of a first conductivity type formed between said first major surface and said second major surface of said semiconductor substrate;
   a second base layer of a second conductivity type formed on said first major surface of said semiconductor substrate;
   a carrier stored layer of a first conductivity type formed between said first base layer and said second base layer of said semiconductor substrate, and having a high-concentration impurity layer that has a higher impurity concentration than said first base layer;
   an emitter layer selectively formed in said second base layer of said semiconductor substrate, and having a predetermined distance from said carrier stored layer;
   a trench extending from said first major surface of said semiconductor substrate through said emitter layer and said second base layer;
   an insulating film covering the inner surface of said trench;
   an electrode buried in said trench through said insulating film; and
   a collector layer of a second conductivity type formed on said second major surface of said semiconductor substrate, wherein
   said high-concentration impurity layer has a thickness of 1.5 µm or more, and the impurity concentration of said high-concentration impurity layer has a constant value of $1.0 \times 10^{16}$ cm$^{-3}$ or more throughout a substantial depth of said high-concentration impurity layer.

2. The insulated gate semiconductor device according to claim 1, wherein:
   said high-concentration impurity layer in said carrier stored layer is formed so as to contact said second base layer; and
   the impurity concentration of portions other than said high-concentration impurity layer in said carrier stored layer is higher than the impurity concentration of said first base layer, and is lower than the impurity concentration of said high-concentration impurity layer.

3. The insulated gate semiconductor device according to claim 1, wherein said high-concentration impurity layer in said carrier stored layer is formed so as to be apart from said second base layer.

4. The insulated gate semiconductor device according to claim 1, wherein the impurity concentration of said carrier stored layer in the depth direction of said semiconductor substrate is stepwise varied at boundaries between said high-concentration impurity layer and other portions.

5. The insulated gate semiconductor device according to claim 1, wherein the impurity concentration of said high-concentration impurity layer in the depth direction of said semiconductor substrate is within a range between $1.0 \times 10^{16}$ cm$^{-3}$ and $1.0 \times 10^{17}$ cm$^{-3}$.

6. The insulated gate semiconductor device according to claim 1, wherein said trench is formed extending through said carrier stored layer.

7. The insulated gate semiconductor device according to claim 1, wherein:
an emitter electrode electrically connected to said emitter layer is formed on said first major surface of said semiconductor substrate; and
a collector electrode electrically connected to said collector layer is formed on said second major surface of said semiconductor substrate.

8. The insulated gate semiconductor device according to claim 1, wherein said carrier stored layer is formed using epitaxial growth method.

9. A method for manufacturing an insulated gate semiconductor device comprising:
forming a carrier stored layer having a high-concentration impurity layer of a first conductivity type that has higher impurity concentration than a first base layer of a first conductivity type formed between a first major surface and a second major surface of a semiconductor substrate within a range from said first major surface to a first depth of said semiconductor substrate;
forming a second base layer of a second conductivity type contacting said high-concentration impurity layer of said carrier stored layer within a range from said first major surface to a second depth shallower than said first depth of said semiconductor substrate;
selectively forming an emitter layer of the first conductivity type within a range from said first major surface to a third depth shallower than said second depth of said semiconductor substrate;
forming a trench extending from said first major surface of said semiconductor substrate through said emitter layer and said second base layer;
covering the inner surface of said trench with an insulating film;
burying an electrode film in said trench through said insulating film; and
forming a collector layer of the second conductivity type on said second major surface of said semiconductor substrate, wherein
said high-concentration impurity layer has a thickness of 1.5 μm or more, and the impurity concentration of said high-concentration impurity layer has a constant value of $1.0 \times 10^{16}$ cm$^{-3}$ or more throughout a substantial depth of said high-concentration impurity layer.

10. A method for manufacturing an insulated gate semiconductor device comprising:
forming a carrier stored layer having a high-concentration impurity layer of a first conductivity type that has higher impurity concentration than a first base layer of a first conductivity type formed between a first major surface and a second major surface of a semiconductor substrate within a range from said first major surface to a first depth of said semiconductor substrate;
forming a second base layer of a second conductivity type spaced from said high-concentration impurity layer of said carrier stored layer within a range from said first major surface to a second depth shallower than said first depth of said semiconductor substrate;
selectively forming an emitter layer of the first conductivity type within a range from said first major surface to a third depth shallower than said second depth of said semiconductor substrate;
forming a trench extending from said first major surface of said semiconductor substrate through said emitter layer and said second base layer;
covering the inner surface of said trench with an insulating film;
burying an electrode film in said trench through said insulating film; and
forming a collector layer of the second conductivity type on said second major surface of said semiconductor substrate, wherein
said high-concentration impurity layer has a thickness of 1.5 μm or more, and the impurity concentration of said high-concentration impurity layer has a constant value of $1.0 \times 10^{16}$ cm$^{-3}$ or more throughout a substantial said high-concentration impurity layer.

11. The method for manufacturing an insulated gate semiconductor device according to claim 9, wherein said trench is formed extending through said carrier stored layer in the step for forming said trench.

12. The method for manufacturing an insulated gate semiconductor device according to claim 10, wherein said trench is formed extending through said carrier stored layer in the step for forming said trench.

13. The method for manufacturing an insulated gate semiconductor device according to claim 9, wherein the step for forming said carrier stored layer is carried out using an epitaxial growth method.

14. The method for manufacturing an insulated gate semiconductor device according to claim 10, wherein the step for forming said carrier stored layer is carried out using an epitaxial growth method.

15. The method for manufacturing an insulated gate semiconductor device according to claim 10, wherein the step for forming said carrier stored layer is carried out using an ion implantation method or a proton irradiation method.

* * * * *